United States Patent
Snow et al.

(10) Patent No.: US 9,753,138 B1
(45) Date of Patent: Sep. 5, 2017

(54) TRANSDUCER MEASUREMENT

(71) Applicant: Microsoft Technology Licensing, LLC, Redmond, WA (US)

(72) Inventors: Dane Snow, Santa Clara, CA (US); Barry Thompson, Menlo Park, CA (US); Mustansir Mukadam, San Francisco, CA (US); Stefan Wurster, Livermore, CA (US); Shaun McCarthy, Rutland, VT (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/097,707

(22) Filed: Apr. 13, 2016

(51) Int. Cl.
| | | |
|---|---|---|
| *H04N 5/374* | (2011.01) | |
| *G01S 17/08* | (2006.01) | |
| *G01K 13/00* | (2006.01) | |
| *G01J 3/46* | (2006.01) | |
| *H04N 13/02* | (2006.01) | |

(Continued)

(52) U.S. Cl.
CPC ............ *G01S 17/08* (2013.01); *G01J 3/46* (2013.01); *G01K 13/00* (2013.01); *H04N 5/378* (2013.01); *H04N 5/37455* (2013.01); *H04N 5/37457* (2013.01); *H04N 13/0207* (2013.01); *H04N 13/0246* (2013.01)

(58) Field of Classification Search
CPC .... G01S 17/08; G01K 13/00; H04N 5/37457; H04N 13/0246; H04N 13/0207; H04N 5/378; H04N 5/37455; G01J 3/46
See application file for complete search history.

(56) References Cited

U.S. PATENT DOCUMENTS

| | | |
|---|---|---|
| 4,752,741 A | 6/1988 | Kim et al. |
| 5,066,140 A | 11/1991 | Beran |
| 5,281,860 A | 1/1994 | Krenik et al. |

(Continued)

OTHER PUBLICATIONS

Tuthill, Mike, "A Switched Current, Switched Capacitor Temperature Sensor in 0.6u CMOS", In Proceedings of the 23rd European Solid-State Circuits Conference, Sep. 16, 1997, 4 pages.

(Continued)

*Primary Examiner* — Twyler Haskins
*Assistant Examiner* — Padma Haliyur
(74) *Attorney, Agent, or Firm* — Baker & Hostetler LLP

(57) ABSTRACT

A transducer such as a translinear proportional-to-absolute-temperature sensor uses two amplifiers, where each amplifier is used in a variety of modes. The first amplifier generates a measurement voltage though feedback in an analog circuit. The second amplifier samples and integrates the measurement in a switched-capacitor mode, and the output is stored on a capacitor. Then the first amplifier is set to measure its offset. The offset is sampled and integrated by the second amplifier, and the output is stored on a second capacitor. Then the first and second amplifiers are set to buffer the voltages stored on the capacitors. The measurement can then be offset-adjusted by digital or analog means. The adjusted measurement is then available to be used for calibration of, e.g., an image sensor. Other transducers, such as pressure sensors, strain sensors, gyroscopes, magnetometers, accelerometers, and xyz positioning sensors may employ the same dual amplifier approach.

20 Claims, 17 Drawing Sheets

(51) Int. Cl.
*H04N 5/3745* (2011.01)
*H04N 5/378* (2011.01)

(56) References Cited

U.S. PATENT DOCUMENTS

| | | | |
|---|---|---|---|
| 5,838,191 A | 11/1998 | Opris et al. | |
| 6,008,685 A | 12/1999 | Kunst | |
| 6,019,508 A | 2/2000 | Lien | |
| 6,037,833 A * | 3/2000 | Ang | G05F 3/267 323/313 |
| 6,433,529 B1 * | 8/2002 | Chowdhury | G05F 3/30 323/280 |
| 6,509,782 B2 * | 1/2003 | Chowdhury | G05F 3/30 327/512 |
| 6,869,216 B1 | 3/2005 | Holloway et al. | |
| 7,010,440 B1 | 3/2006 | Lillis et al. | |
| 7,176,701 B2 * | 2/2007 | Wachi | H03F 3/45085 324/537 |
| 7,429,129 B2 | 9/2008 | St. Pierre et al. | |
| 7,648,270 B2 | 1/2010 | Faour et al. | |
| 7,686,508 B2 | 3/2010 | Lin et al. | |
| 7,956,670 B2 | 6/2011 | Kang | |
| 8,143,574 B2 * | 3/2012 | Endo | G01J 5/20 250/252.1 |
| 8,210,743 B2 * | 7/2012 | Hasegawa | G01K 7/01 327/512 |
| 9,182,295 B1 | 11/2015 | Perrott et al. | |
| 2005/0099163 A1 | 5/2005 | Liepold | |
| 2006/0273804 A1 | 12/2006 | Delorme et al. | |
| 2009/0015240 A1 | 1/2009 | Kobayashi | |

OTHER PUBLICATIONS

Pertijus, et al., "A CMOS smart temperature sensor with a 3σ inaccuracy of ±0.1°C from −55°C to 125°C", In IEEE Journal of Solid-State Circuits, vol. 40, No. 12, Dec. 2005, pp. 2805-2815.
"International Search Report and Written Opinion Issued in PCT Application No. PCT/US2017/026032", dated Jun. 27, 2017, 12 Pages.

* cited by examiner

TRANSDUCER MEASUREMENT

BACKGROUND

Transducers such as temperature sensors, a pressure sensor, and strain sensors may include or be paired with amplifiers. Such transducers include differential temperature sensors, such as proportional-to-absolute-temperature (PTAT) circuits and translinear PTAT circuits.

SUMMARY

A transducer such as a translinear proportional-to-absolute-temperature (PTAT) sensor uses two amplifiers, where each amplifier is used in a variety of modes. The first amplifier generates a measurement voltage though feedback in an analog circuit. The second amplifier samples and integrates the measurement in a switched-capacitor mode, and the output is stored on a capacitor. Then the first amplifier is set to measure its offset. The offset is sampled and integrated by the second amplifier, and the output is stored on a second capacitor. Then the first and second amplifiers are set to buffer the voltages stored on the capacitors. The measurement can then be offset-adjusted by digital or analog means. The adjusted measurement is then available to be used for calibration of, e.g., an image sensor such as a time-of-flight depth camera sensor. Other transducers, such as non-translinear differential temperature sensors, pressure sensors, strain sensors, gyroscopes, magnetometers, accelerometers, and xyz positioning sensors may employ the same dual amplifier approach.

In an exemplary embodiment, the PTAT utilizes two current sources with a scaling factor K between two binary junction transistor (BJT) currents, hence setting one source to a current I and the other source to a current $K*I$. There is no resistor in this implementation and the difference amplifier is used in a feedback loop to drive the base voltage of the M times scaled BJT and to generate a PTAT voltage at its output. Relying on scaling ratios and programmable gain instead of precise resistor matching provides a more accurate PTAT system that is robust to process sensitivities and mismatch. The architecture also maintains linearity of the output over a wide temperature range by cancelling input referred amplifier offsets.

Programmable gain may be achieved by iterating switched-capacitor amplification operations. Reuse of the amplifiers allows sampling and cancelling errors that arise due to amplifier offsets. This allows the system to maintain linearity over a large temperature range. Reusing components such as amplifiers to perform a variety of operations saves area and power while maintaining performance. The techniques for programmable gain, error cancelling, and reuse of components may be applied to other transducer types, such as non-translinear differential temperature sensors, pressure sensors, strain sensors, gyroscopes, magnetometers, accelerometers, and xyz positioning sensors.

This summary is provided to introduce a selection of concepts in a simplified form that are further described below in the detailed description. This summary is not intended to identify key features or essential features of the claimed subject matter, nor is it intended to be used to limit the scope of the claimed subject matter. Furthermore, the claimed subject matter is not limited to limitations that solve any or all disadvantages noted in any part of this disclosure.

DETAILED DESCRIPTION

Figure 1:
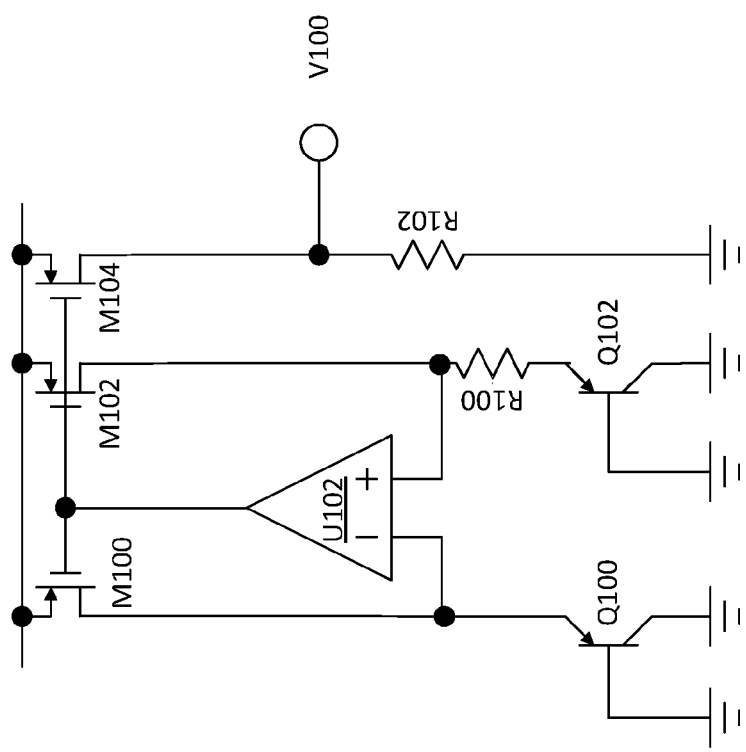
FIG. 1 is a schematic of circuit with proportional-to-absolute-temperature (PTAT) analog reference generators.

A transducer such as a proportional-to-absolute-temperature sensor uses two amplifiers, where each amplifier is used in a variety of modes. First, the first amplifier generates a temperature-dependent measurement voltage though feedback in an analog circuit. Next, the second amplifier samples and integrates the measurement in a switched-capacitor mode, and the output is stored on a capacitor. Then, the first amplifier is set to measure its offset. The offset is sampled and integrated by the second amplifier, and the output is stored on a second capacitor. Then, the first and second amplifiers are set to buffer the voltages stored on the capacitors. The measurement can then be offset-adjusted by digital or analog means. The adjusted measurement is then available to be used for calibration of, e.g., an image sensor. For example, the image sensor may be part of a color camera, where thermal calibration is useful in capturing true colors. Alternatively, the image sensor may be part of a depth camera system such as a time-of-flight depth camera useful in determining the position and movements of a player in a video gaming system, where thermal calibration is useful in making more accurate assessments of player position and movements.

The analog sensor circuit is a proportional-to-absolute-temperature (PTAT) circuit that includes two scaled BJT transistors, two scaled current sources, and a first amplifier that is used in a feedback loop. The differential inputs of the amplifier are connected to the emitters of the BJTs. The output of the first amplifier drives the base voltage of one BJT and generates a PTAT voltage at its output. Unlike many other PTAT circuits, there are no resistors, and therefore there is no need for high resistor values or for close resistor value matching. Relying on scaling ratios instead of precise resistor matching provides a more accurate PTAT system that is robust to process sensitivities and mismatch.

The PTAT voltage is amplified by a second amplifier operating as a switched capacitor amplifier with ratio-metric gain. The gain may be programmed by setting the number of iterations of the switched-capacitor sample and integration phases.

Both amplifiers are reused, first to take an offset reading, and then to buffer temperature measurement and offset readings. The reuse of the amplifiers provides not only the economy of reduced integrated circuit area and power savings, but also provides for self-cancelling operations whereby the output is essentially unaffected by variations in bias voltage values or the offsets of either amplifier. This provides very high linearity of the system over wide temperature variations, which in turn reduces the need for system calibration.

The techniques for programmable gain, error cancelling, and reuse of components may be applied to other transducer types, such as a non-translinear differential temperature sensor, a pressure sensor, strain sensor, gyroscope, magnetometer, accelerometer, or xyz positioning sensor.

FIG. 1 is a schematic of a proportional-to-absolute-temperature (PTAT) circuit 100 with analog reference generators. Two scaled bipolar junction transistors (BJTs) Q100 and Q102, where Q102 is M times larger than Q100, provide output current components with a positive or negative temperature coefficient. The emitter terminal of Q100 is connected to the negative inputs of an amplifier U102. The emitter terminal of Q102 is connected to the positive input of the amplifier through resistor R100. The output of amplifier U102 is fed to the gates of MOSFETs M100, M102, and M104 to generate currents with a temperature coefficient. The sources of MOSFETs M100, M102, and M104 are connected to a positive supply voltage. The drain of MOSFET 100 feeds the emitter of BJT Q100. The drain of MOSFET 102 feeds the emitter of BJT Q102 through a resistor R100. The drain of MOSFET 104 feeds another resistor R102, to provide an output voltage V100, where the other end of R102 is connected to ground. By connecting the gate of M100, M102, and M104, the reference current through the BJTs is translated to the temperature-dependent voltage V100 through resistor R102. Further amplification of voltage V100 may be performed, e.g., before digitization.

The PTAT topology of FIG. 1 has a low gain and requires large resistor values and precise matching to reduce process sensitivity. Further, since the voltage generated by the PTAT core is single-ended, any subsequent amplifiers may degrade linearity of the system, decrease noise immunity, and hurt system sensitivity. This may lead to unpredictability in measured temperature, even over a moderate range of temperature. Also, the amplifier U102 used to generate $\Delta V_{BE}$ in the feedback configuration of FIG. 1 suffers from input referred offsets of U102 which translate to uncertainties in the temperature-dependent output.

Figure 2:
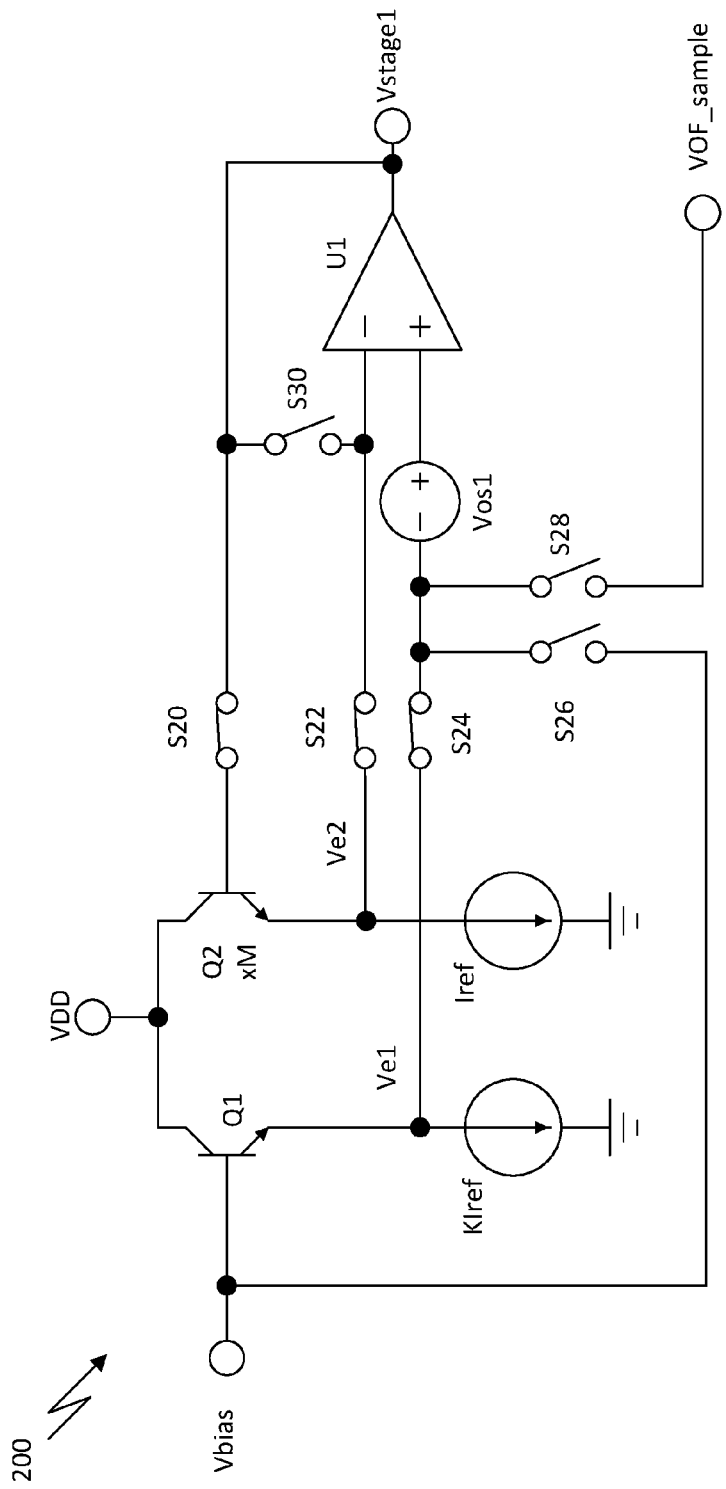
FIG. 2 is a schematic of an example trans-linear temperature sensor stage, including an amplifier with multiple modes of operation, with switches set to take a temperature measurement.

FIG. 2 is a schematic of an example transducer in the form of a trans-linear temperature sensor stage 200. Q1 and Q2 are NPN BJT transistors that may be of different sizes, where Q2 is scaled by a factor of M relative to Q1. The collectors of Q1 and Q2 are connected to positive supply voltage VDD. The emitter of Q2 is connected to a current source $I_{ref}$. The emitter of Q1 is connected to a scaled current source $KI_{ref}$, where K is a factor relative to $I_{ref}$. The emitters are further connected through switches S22 and S24 to the negative and positive inputs of an operational amplifier (op-amp) U1. Op-amp U1 may be implemented, for example, in a folded cascode configuration. The output of op-amp U1 is connected to the base of transistor Q2 via switch S20 in a negative feedback configuration. The base of Q1 is connected to an external voltage $V_{bias}$. The input-referred offset of the op-amp U1 is depicted in FIG. 2 as $V_{OS1}$.

In FIG. 2, switches S20, S22, and S24 are shown closed. In this configuration, the sensor stage 200 is used to generate a voltage Vstage1 that is proportional to temperature. Switches S26, S28, and S30 are used to set the sensor stage 200 to other operational modes. With S20, S22, and S24 open, switch 30 may be closed to place op-amp U1 in unitary gain mode. Switch 26 or switch 28 may then be closed to connect either $V_{bias}$ or $V_{OF\_sample}$ to the positive input of op-amp U1, so that op-amp U1 of sensor stage 200 may serve to buffer these voltages.

With switches S20, S22, and S24 closed and switches S26, S28, and S30 open, as shown in FIG. 2, sensor stage 200 is in temperature measurement mode. In this mode, the currents through BJTs Q1 and Q2 are given by Equations 1 and 2 in terms of the reference current $I_{ref}$, the current scaling factor K, and the BJT scaling factor M, where $I_S$ is the base current and $V_T$ is the thermal voltage. The thermal voltage $V_T$=kT/q, where k is Boltzmann's constant, q is the charge of an electron, and T is the temperature.

$$I_{Q1} = KI_{ref} = I_S e^{\frac{V_{be1}}{V_T}} \qquad \text{Equation 1}$$

$$I_{Q2} = I_{ref} = MI_S e^{\frac{V_{be2}}{V_T}} \qquad \text{Equation 2}$$

Equations (1) and (2) can be rewritten in terms of the base emitter voltages of the transistors Q1 and Q2 as Equations 3 and 4.

$$V_{be1} = V_T \ln\left(\frac{KI_{ref}}{I_S}\right) \qquad \text{Equation 3}$$

$$V_{be2} = V_T \ln\left(\frac{I_{ref}}{MI_S}\right) \qquad \text{Equation 4}$$

Since the op-amp U1 is designed to have a very high gain, $V_{e1}=V_{e2}$. The output voltage $V_{stage1}$ of the op-amp U1 is thus given by Equation 5:

$$V_{stage1}=V_{e2}+V_{be2}=V_{e1}+V_{os1}+V_{be2} \rightarrow V_{stage1}=V_{bias}- \\ V_{be1}+V_{os1}+V_{be2} \rightarrow V_{stage1}=V_{bias}+V_{os1}+V_{be2}-V_{be1} \qquad \text{Equation 5}$$

$\Delta V_{BE}$, the difference in the base emitter voltages of the two transistors Q1 and Q2, is then given in Equation 6, where kT/q is the thermal voltage $V_T$:

$$V_{be2} - V_{be1} = \frac{kT}{q}\left(\ln\left(\frac{KMI_{ref}I_S}{I_{ref}I_S}\right)\right) \qquad \text{Equation 6}$$

Substituting (6) in (5), the output $V_{stage1}$ of the op-amp U1 can be represented in terms of the temperature-dependent voltage and an offset term in Equation 7:

$$V_{stage1} = \underbrace{V_{bias} + V_{os1}}_{Offset} - \underbrace{\frac{kT}{q}(\ln(KM))}_{Slope} \qquad \text{Equation 7}$$

In Equation 7, the output of the op-amp U1 has a temperature-dependent, process invariant voltage determined by the scaling ratio M of the NPN devices Q1 and Q2, the current sources $I_{ref}$ and $KI_{ref}$, Boltzmann's constant k, and the charge of an electron q. The output voltage also has an offset term determined by the bias voltage of Q1 and the offset of the op-amp.

Figure 3:
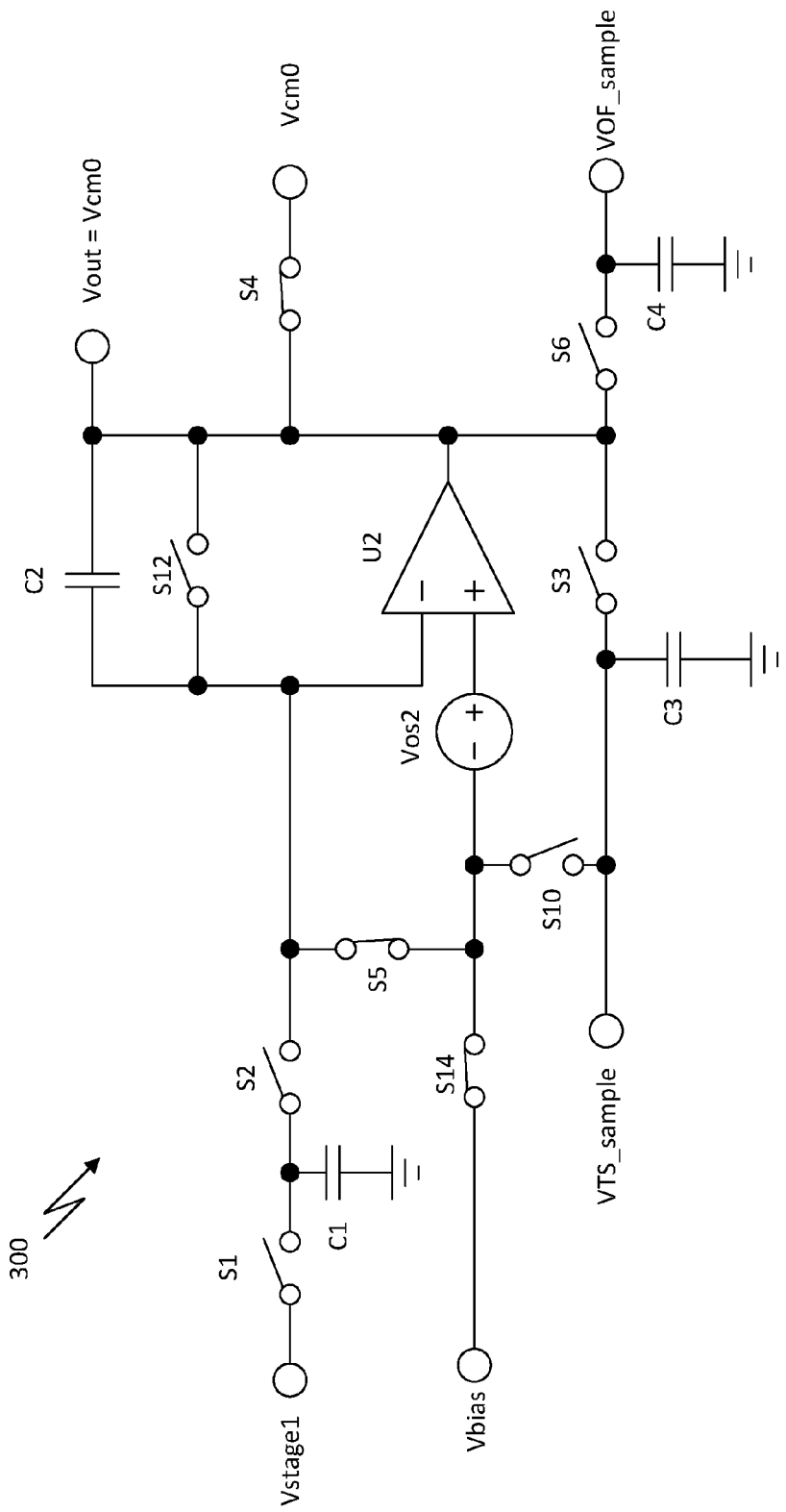
FIG. 3 is a schematic of an example switched capacitor gain stage, including an amplifier with multiple modes of operation, with switches set to clear the gain stage.

FIG. 3 is a schematic of a switched capacitor gain stage 300 which may be used to amplify the outputs $V_{stage1}$ of the sensor stage 200 of FIG. 2. The $V_{stage1}$ input is connected to $V_{stage1}$ output of FIG. 2.

In FIG. 3, there is a second high gain op-amp U2. Op-amp U2 also may be implemented, for example, as a folded cascode configuration op-amp similar to op-amp U1. Op-amp U2 is depicted as having an input referred offset $V_{OS2}$. Capacitors C1 and C2 are used as ratio-metric amplification terms for voltage amplification. Capacitor C3 is used to sample and hold an amplified temperature sensor voltage $V_{TS\_sample}$. Capacitor C4 is used to sample and hold an amplified offset voltage $V_{OF\_sample}$. $V_{cm0}$ is an externally applied common mode voltage used to reset the gain stage 300. $V_{bias}$ is the same voltage that was also applied, e.g., to the base of BJT Q1 in FIG. 2.

The switches in FIG. 3 are used to set the operation mode of the gain stage 300. Sample switch S1 is used for sampling the input $V_{stage1}$ onto sample capacitor C1 during a sample phase. Integrate switch S2 connects the sample capacitor C1 to the input negative differential input of op-amp U2 during an integrate phase. Hold switch S3 is used to connect the op-amp U2 output voltage $V_{out}$ to the hold capacitor C3 for sensor readings. Hold switch S6 is used to connect the output voltage Vout to the hold capacitor C4 for offset readings. Switches S4 and S5 are used to clear the integrator, by resetting the inputs to the op-amp U1 and the voltage across C2. Switch 14 connects $V_{bias}$ to the positive differential input of the op-amp U2 during sample, integrate, and hold modes. Unity gain switch S12 sets the op-amp U2 into unity buffer mode. Switch S10 connects the hold capacitor C3 to the positive differential input of the op-amp U1 for buffering.

FIG. 3 shows the gain stage 300 in clear mode, with switches S4, S5, and S14 closed. The remaining switches are open. This sets the initial conditions for sample, integrate, and hold operations.

Figure 4:
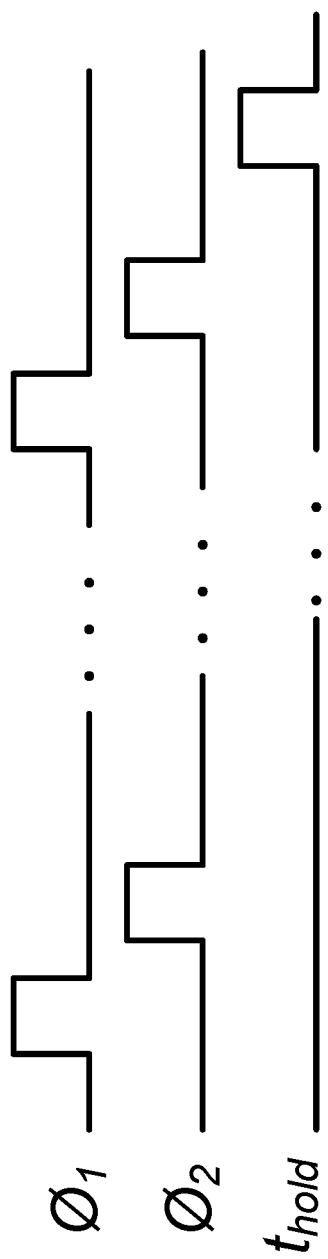
FIG. 4 is a timing diagram for sample, integration, and hold modes of operation of the gain stage of FIG. 3.

FIG. 4 is an example timing diagram for operations of gain stage 300. First a sample phase φ1 is conducted, followed by an integrate phase φ2. Phases φ1 and φ2 may be repeated N times to increase op-amp U2 output voltage $V_{out}$. At the end of the integrate cycles, at $t_{hold}$, output voltage $V_{out}$ is connected to one of the hold capacitors, either C3 or C4.

Figure 5:
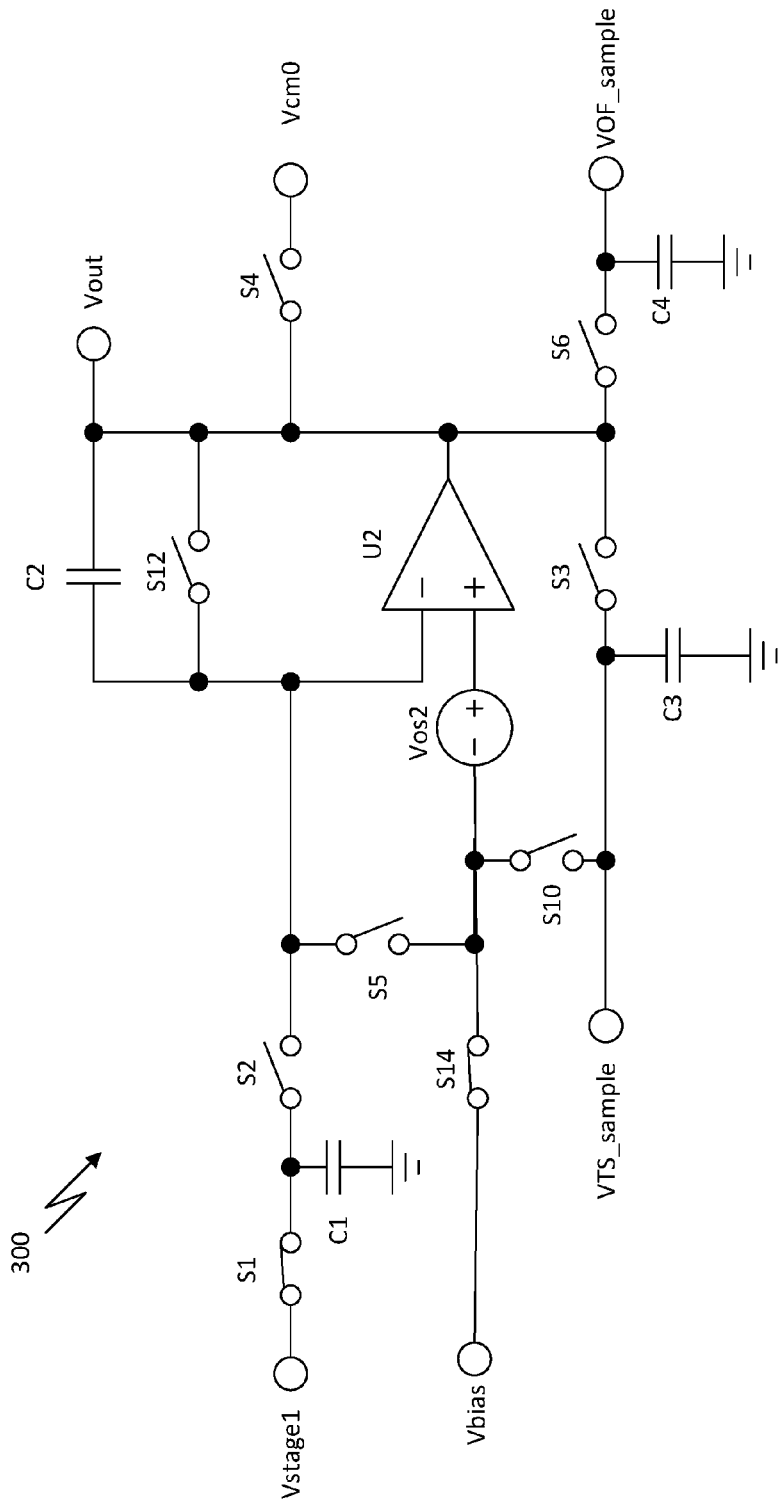
FIG. 5 is a schematic of the gain stage of FIG. 3 with switches set to sample the input from the sensor stage.

FIG. 5 shows the gain stage 300 with the switches set for input sampling. As shown in FIG. 5, the clear switches S4 and S5 are opened, and sample switch S1 is closed, e.g., as set by the control signal φ1 signal of FIG. 4. Here in FIG. 5, the input voltage $V_{stage1}$ is now connected to sample capacitor C1. The charge on capacitors C1 and C2 is given by Equations 8A and 8B, where $V_{out0}$ is the initial voltage at the output of op-amp U1, which has been set during the clear mode to $V_{cm0}$.

$$Q_{C1} = V_{stage1} C_1 \qquad \text{Equation 8A}$$

$$Q_{C2} = (V_{bias} + V_{os2} - V_{out0}) C_2 \qquad \text{Equation 8B}$$

Figure 6:
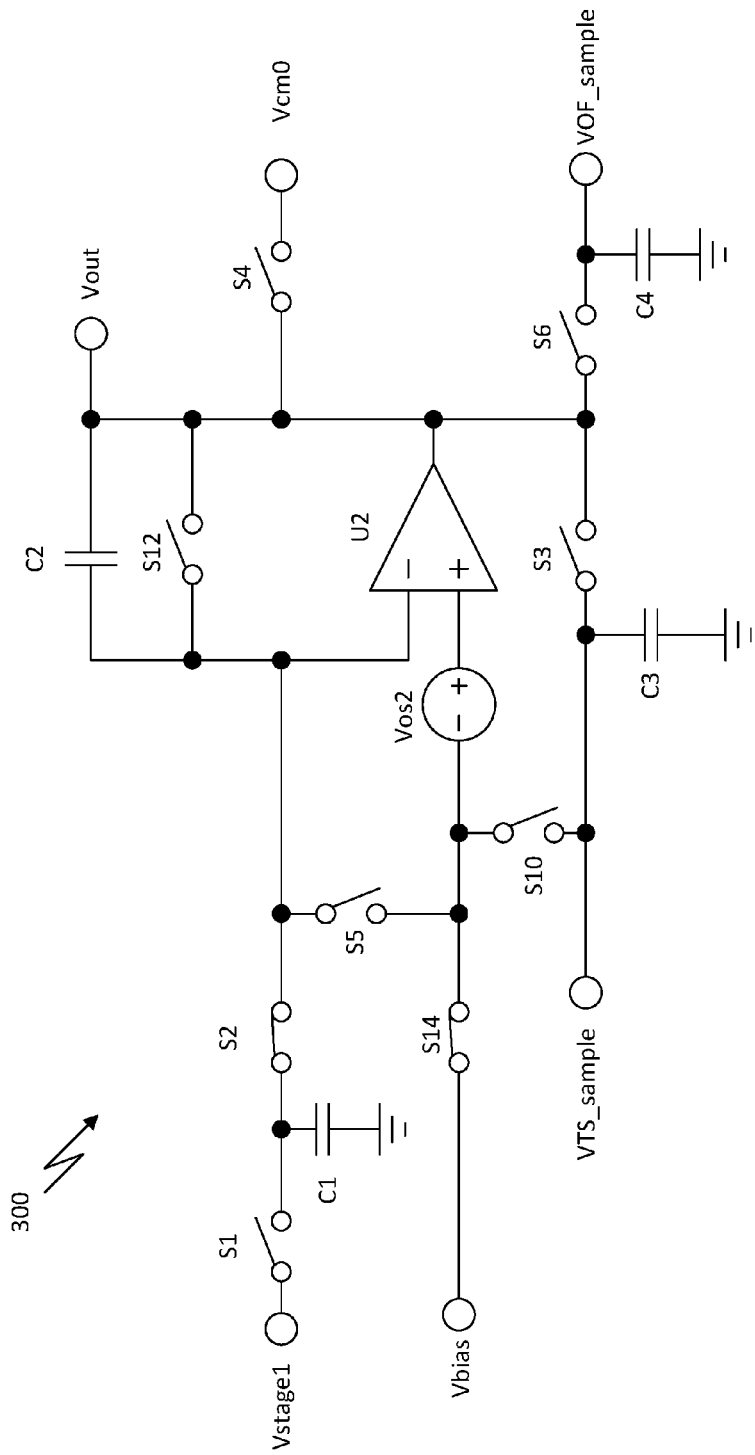
FIG. 6 is a schematic of the gain stage of FIG. 3 with switches set to integrate the sampled input signal.

FIG. 6 shows the gain stage 300 with the switches set for integrate operation. As shown in FIG. 6, sample switch S1 is opened and integrate switch S2 is closed, e.g., by control signal φ2 of FIG. 4. Here in FIG. 6, the sampled voltage $V_{stage1}$ on C1 is ratio-metrically amplified by C2. The charges on C1 and C2 at the end of this cycle are given by Equations 9A and 9B, where $V_{out1}$ is the new value of op-amp U1 output $V_{out}$.

$$Q_{C1} = (V_{bias} + V_{os2}) C_1 \qquad \text{Equation 9A}$$

$$Q_{C2} = (V_{bias} + V_{os2} - V_{out1}) C_2 \qquad \text{Equation 9B}$$

Since the total charge between the sample phase and the integrate phase is conserved, the charge on C2 can also be written as Equation 10:

$$Q_{C2} = (V_{bias} + V_{os2} - V_{out0}) C_2 + (V_{stage1} - V_{bias} - V_{os2}) C_1 \qquad \text{Equation 10}$$

The output voltage at the end of integration is given in Equation 11:

$$V_{out1} = V_{out0} + \frac{C_1}{C_2}(V_{bias} + V_{os2} - V_{stage1}) \qquad \text{Equation 11}$$

The sample-integrate operation may be repeated for N cycles using non-overlapping switch controls, e.g., signals φ1 and φ2 of FIG. 4, to control switches S1 and S2 of gain stage 300. The output voltage at the end of the $N^{th}$ cycle is given in Equation 12:

$$V_{outN} = V_{out0} + \frac{NC_1}{C_2}(V_{bias} + V_{os2} - V_{stage1}) \qquad \text{Equation 12}$$

N is programmable and sets the overall gain of the gain stage 300.

Figure 7:
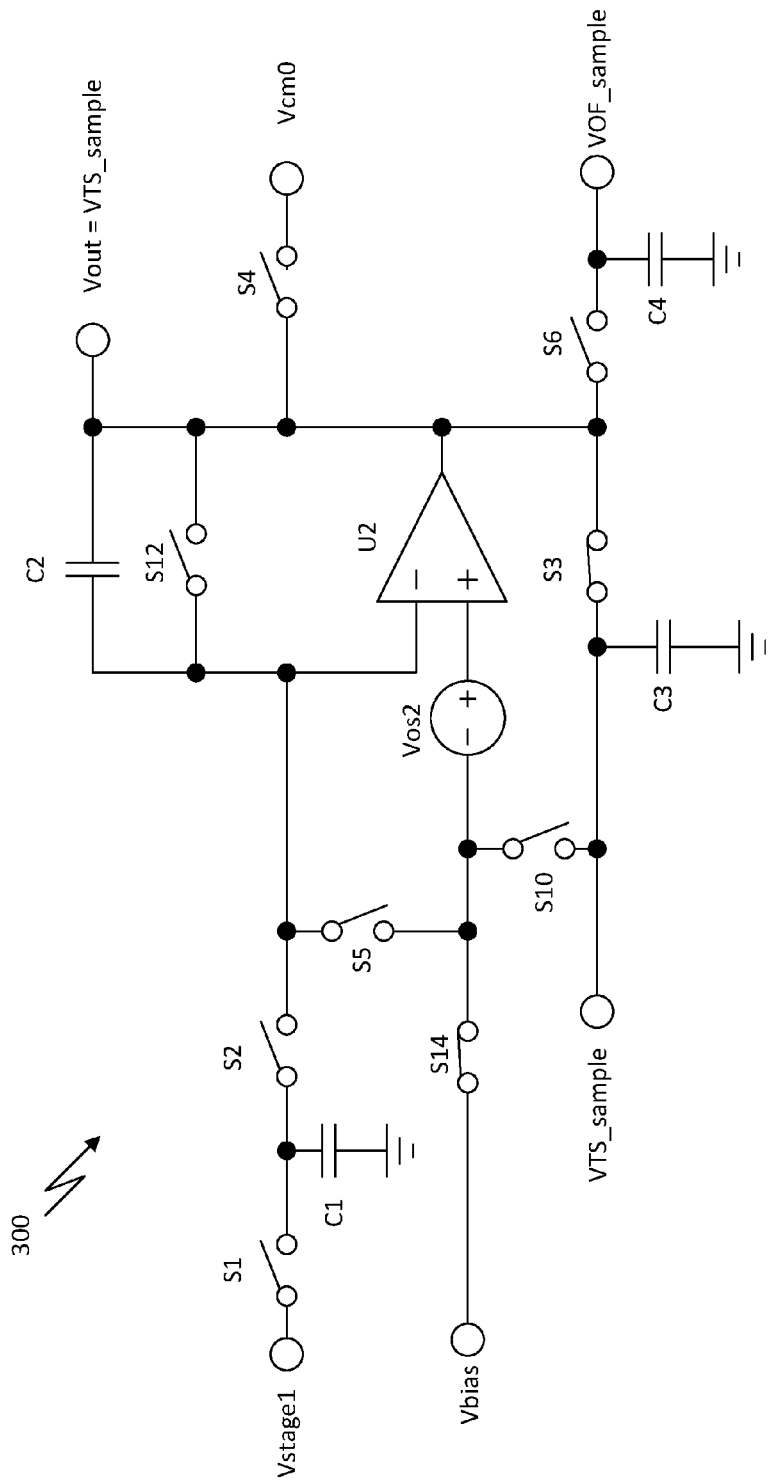
FIG. 7 is a schematic of the gain stage of FIG. 3 with switches set to hold temperature measurement reading onto capacitor C3.

FIG. 7 shows the gain stage 300 with the switches set for temperature measurement output hold. Switches S1 and S2 are opened. Hold switch S3 is closed, e.g., by control signal $t_{hold}$ of FIG. 4. The voltage across C3 at the end of the hold cycle is given in Equation 13:

$$V_{hold} = V_{out0} + \frac{NC_1}{C_2}(V_{bias} + V_{os2} - V_{stage1}) \qquad \text{Equation 13}$$

Since it is the output of the temperature sensor that is being amplified, Equation 7 may be substituted for $V_{stage1}$ to determine the amplified temperature-dependent voltage on C3, as given in Equation 14 where $V_{hold}$, the voltage across C3, is now be referred to as $V_{TS\_Sample}$.

$$V_{TS\_Sample} = V_{out0} + \underbrace{N\frac{C_1}{C_2}(V_{OS2} - V_{OS1})}_{Offset} + \underbrace{N\frac{C_1}{C_2}\left(\frac{k}{q}\right)\ln(KM)T}_{Slope} \qquad \text{Equation 14}$$

Equation 14 contains the temperature-dependent term from the temperature sensor amplified by a factor of $$N\frac{C_1}{C_2}$$

where N is the number of sample-integrate cycles. It is also important to note that $V_{bias}$ is not present in the equation. Thus, there is no strict requirement for the value of $V_{bias}$.

The offsets of op-amps U1 and U2 are also amplified by the factor $$N\frac{C_1}{C_2}.$$

Unless corrected, this may lead to inaccurate, process dependent temperature readings. To eliminate the offsets of both op-amps from the final output, an offset-only sample cycle may be employed where only the offset voltages $V_{os1}$ and $V_{os2}$ are measured. This may be achieved by adjusting the switch settings of sensor stage 200 and gain stage 300.

Figure 8:
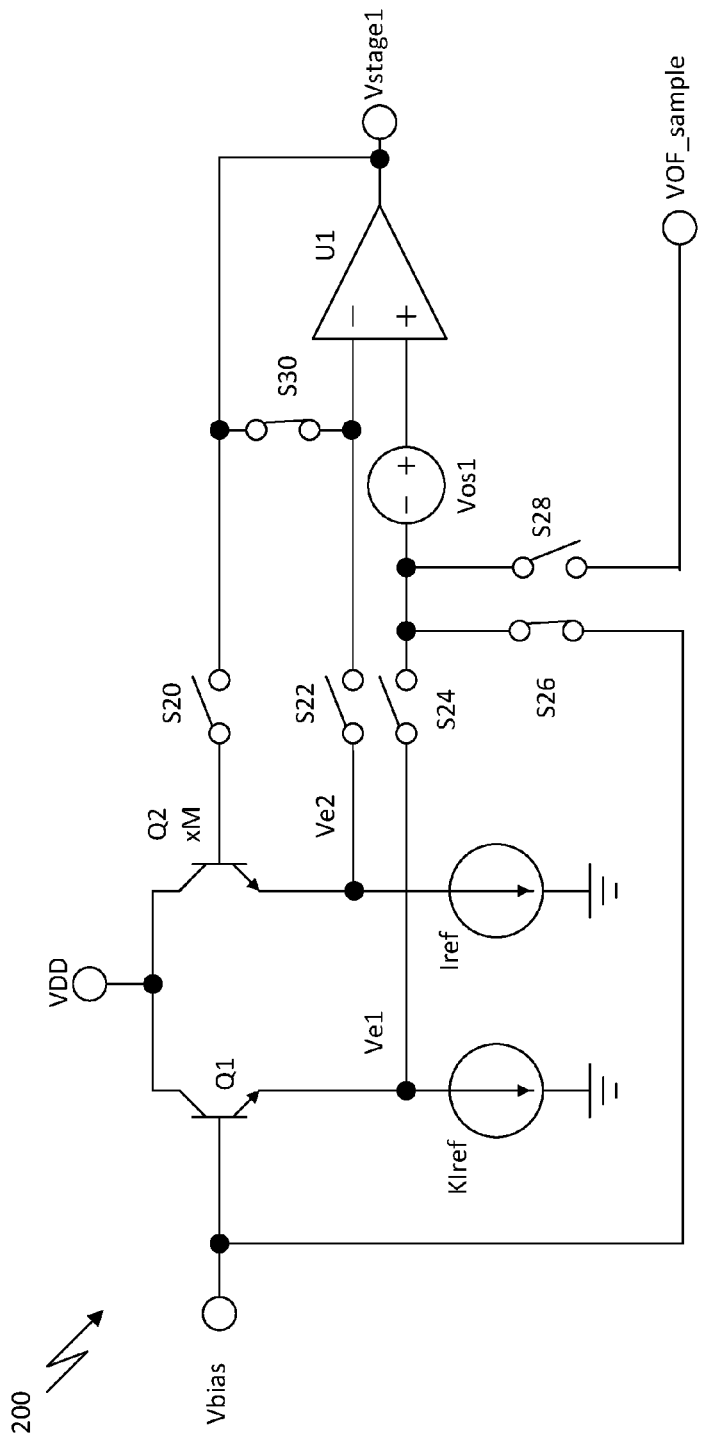
FIG. 8 is a schematic of the sensor stage of FIG. 2 with switches set to measure the offset of the sensor stage.

FIG. 8 shows the sensor stage 200 of FIG. 2 configured for offset measurement. Switches S20, S22, and S24 are opened to disconnect op-amp U1 from the transistors Q1 and Q2 and current sources $T_{ref}$ and $K_{Iref}$. Bias switch S26 is closed to connect the positive differential input of U1 to $V_{bias}$. Feedback switch S30 is closed to set op-amp U1 in unitary gain mode. The output voltage of op-amp U1 in the configuration of FIG. 8 is given by Equation 15:

$$V_{stage1} = V_{bias} + V_{os1} \quad \text{Equation 15}$$

Figure 9:
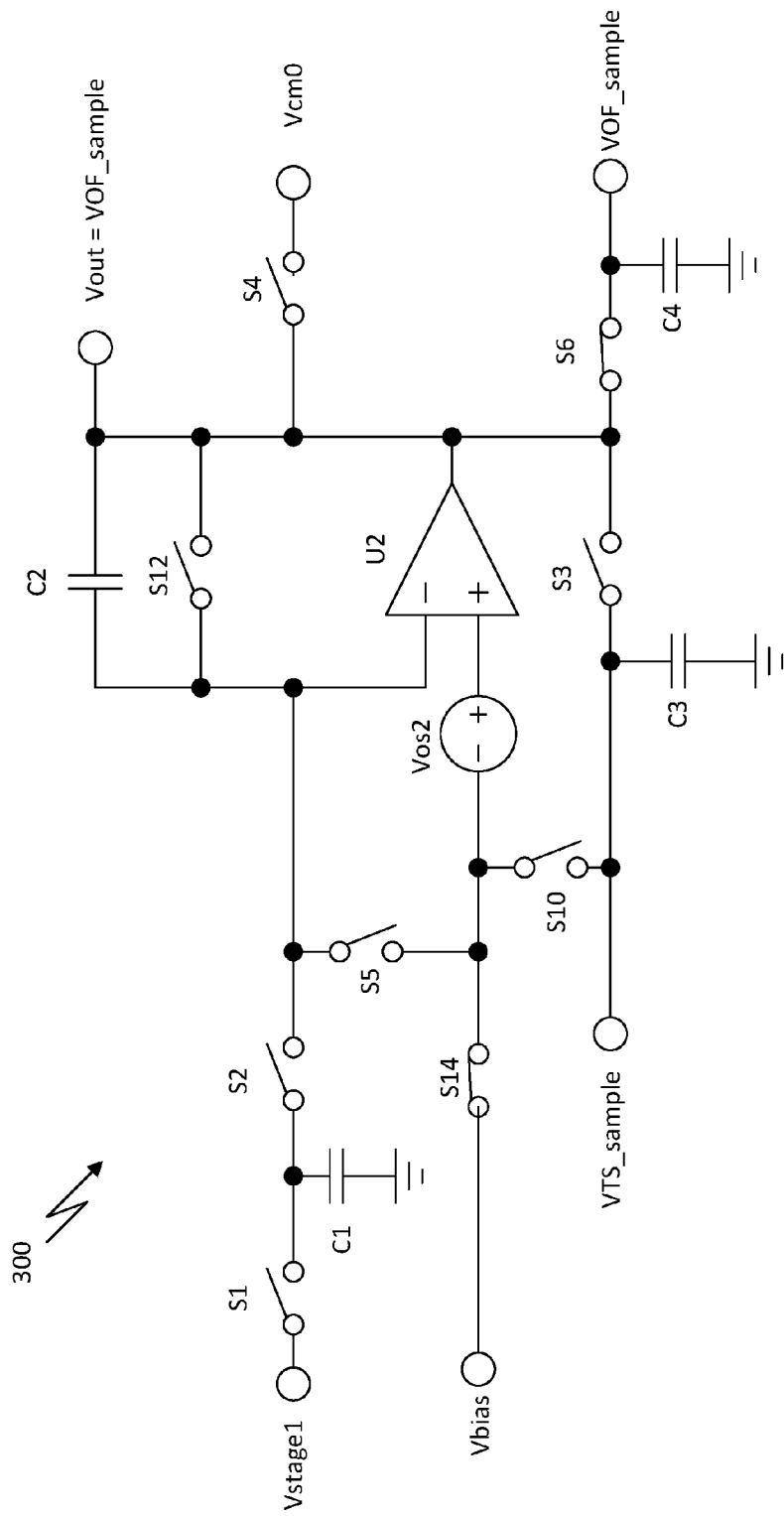
FIG. 9 is a schematic of the gain stage of FIG. 3 with switches set to hold the offset reading onto capacitor C4.

Referring to FIGS. 3-6, the voltage $V_{stage1}$ in Equation 15 may then be fed to the gain stage 300, sampled, and then integrated, e.g., N+1 times. FIG. 9 shows the gain stage 300 set to hold the offset measurement. Only hold switch S6 is closed, connecting output voltage $V_{out}$ to hold capacitor C4. This voltage, which results from the N+1$^{st}$ cycle of the gain stage 300, is referred to as $V_{OF\_Sample}$, and contains only the amplified offsets of both op-amps and the initial condition voltage, as given in Equation 16:

$$V_{OF\_Sample} = V_{out0} + \underbrace{(N+1)\frac{C_1}{C_2}(V_{OS2} - V_{OS1})}_{Offset} \quad \text{Equation 16}$$

At this point, both voltages $V_{TS\_SAMPLE}$ and $V_{OF\_SAMPLE}$ are stored on capacitors C3 and C4 respectively. An offset-cancelled differential output voltage of the temperature sensor system may be derived by re-using op-amps U1 and U2 in unity gain feedback configurations to buffer $V_{TS\_SAMPLE}$ and $V_{OF\_SAMPLE}$.

Figure 10:
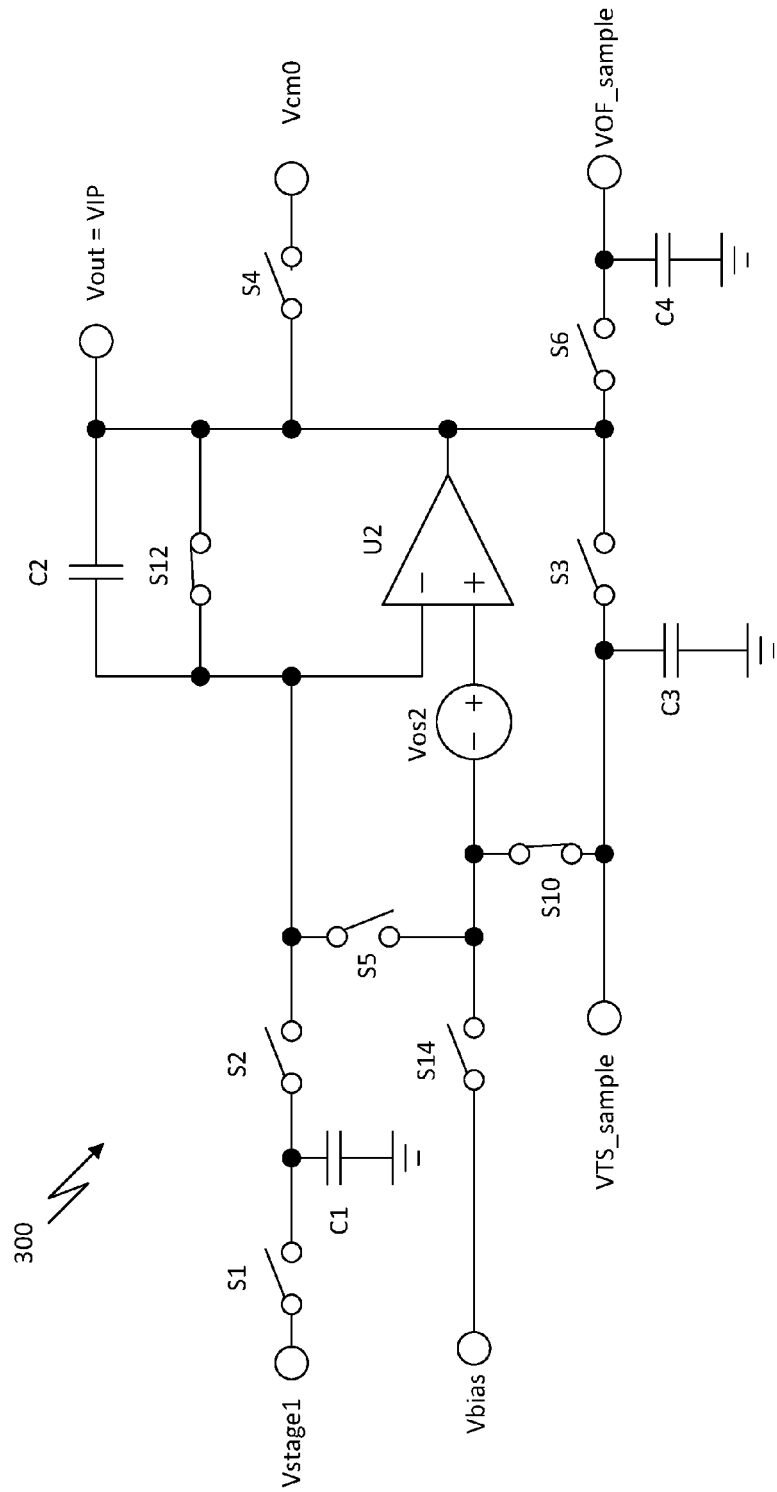
FIG. 10 is a schematic of the gain stage of FIG. 3 with switches set to buffer the temperature measurement reading.

FIG. 10 shows the gain stage 300 with switches set for temperature measurement buffering. Feedback switch S12 is closed to set op-amp U2 in unitary gain mode. Input switch S10 is closed to connect C3 to the positive differential input of op-amp U2. In this configuration, the op-amp U2 output voltage $V_{out}$=VIP as given in Equation 17A:

$$VIP = V_{TS\_Sample} + V_{os2} = \quad \text{Equation 17A}$$
$$V_{out0} + N\frac{C_1}{C_2}(V_{OS2} - V_{OS1}) + N\frac{C_1}{C_2}\left(\frac{k}{q}\right)\ln(KM)T + V_{os2}$$

Figure 11:
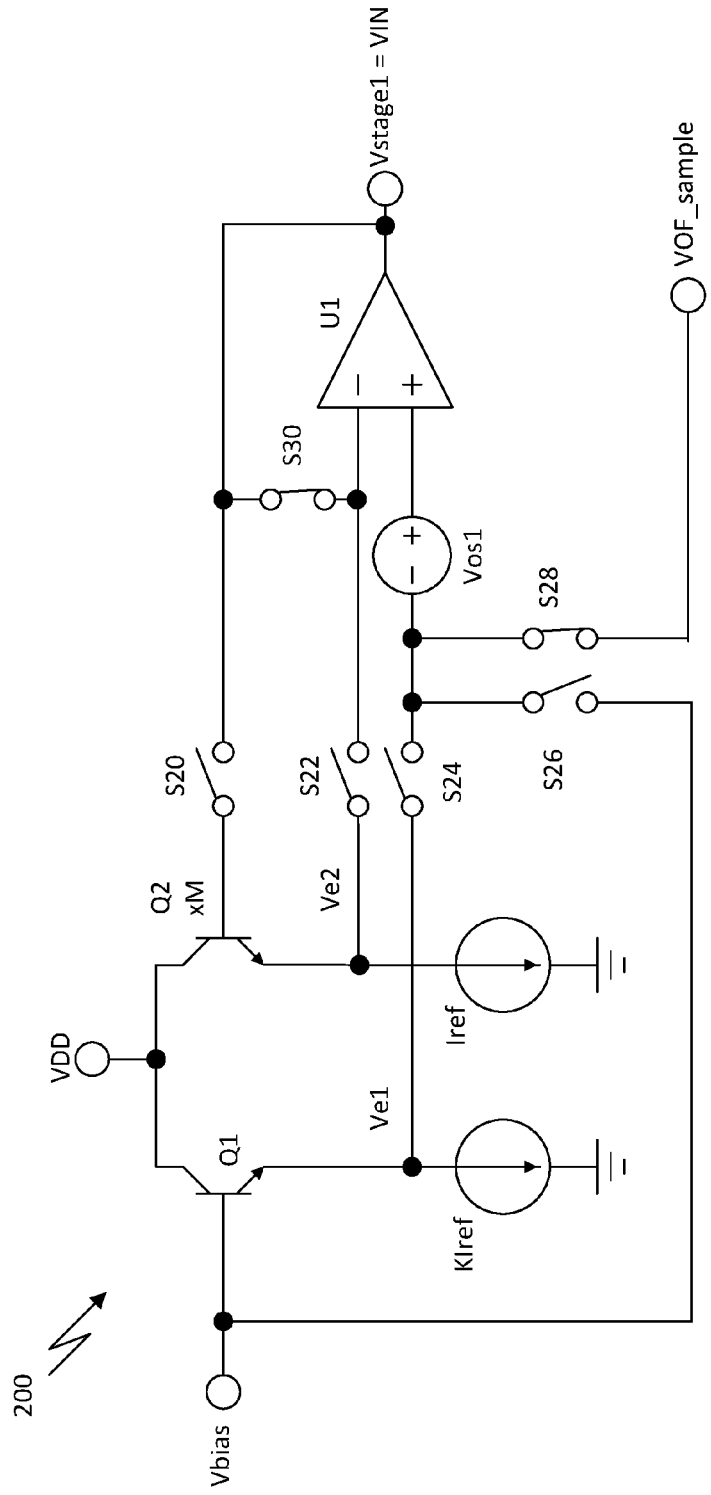
FIG. 11 is a schematic of the sensor stage of FIG. 2 with switches set to offset the temperature measurement reading.

FIG. 11 shows the sensor stage 200 with switches set for offset measurement buffering. As in FIG. 8, here in FIG. 11 switches S20, S22, and S24 are open to disconnect the op-amp U1 from the transistors and current sources, and feedback switch S30 is closed to set op-amp U1 in unitary gain mode. Input switch S28 is closed to connect $V_{OF\_sample}$ to the positive differential input of op-amp U1. $V_{OF\_sample}$ is the voltage on C4, e.g., in FIGS. 9 and 10. In the configuration of FIG. 11, the op-amp U1 output voltage $V_{stage1}$=VIN is given in Equation 17B:

$$VIN = \quad \text{Equation 17B}$$
$$V_{OF_{Sample}} + V_{os1} = V_{out0} + (N+1)\frac{C_1}{C_2}(V_{OS2} - V_{OS1}) + V_{os1}$$

The differential voltage is obtained by subtracting VIN from VIP, as given in Equation 18. This may be accomplished, for example, by digitizing VIN and VIP at an analog-to-digital converter (ADC), and performing the subtraction digitally.

$$VIP - VIN = \quad \text{Equation 18}$$
$$N\frac{C_1}{C_2}\left(\frac{k}{q}\right)\ln(KM)T + (V_{OS2} - V_{OS1})\left[N\frac{C_1}{C_2} + 1 - (N+1)\frac{C_1}{C_2}\right]$$

By sizing C1 and C2 in the gain stage 300 to be identical, the offset term in Equation 18 cancels. We are now left with a final differential output voltage, $V_{TS\_SYSTEM}$, independent of op-amp offsets.

$$V_{TS\_SYSTEM} = VIP - VIN = N\left(\frac{k}{q}\right)\ln(KM)T \quad \text{Equation 19}$$

The differential voltage $V_{TS\_SYSTEM}$ in Equation 19 only exhibits temperature dependency. $V_{TS\_SYSTEM}$ is scaled up by N, the number of integration cycles run in gain stage 300 to amplify the output of the sensor stage 200. $V_{TS\_SYSTEM}$ does not depend on the initial conditions applied on capacitor C2.

Figure 12:
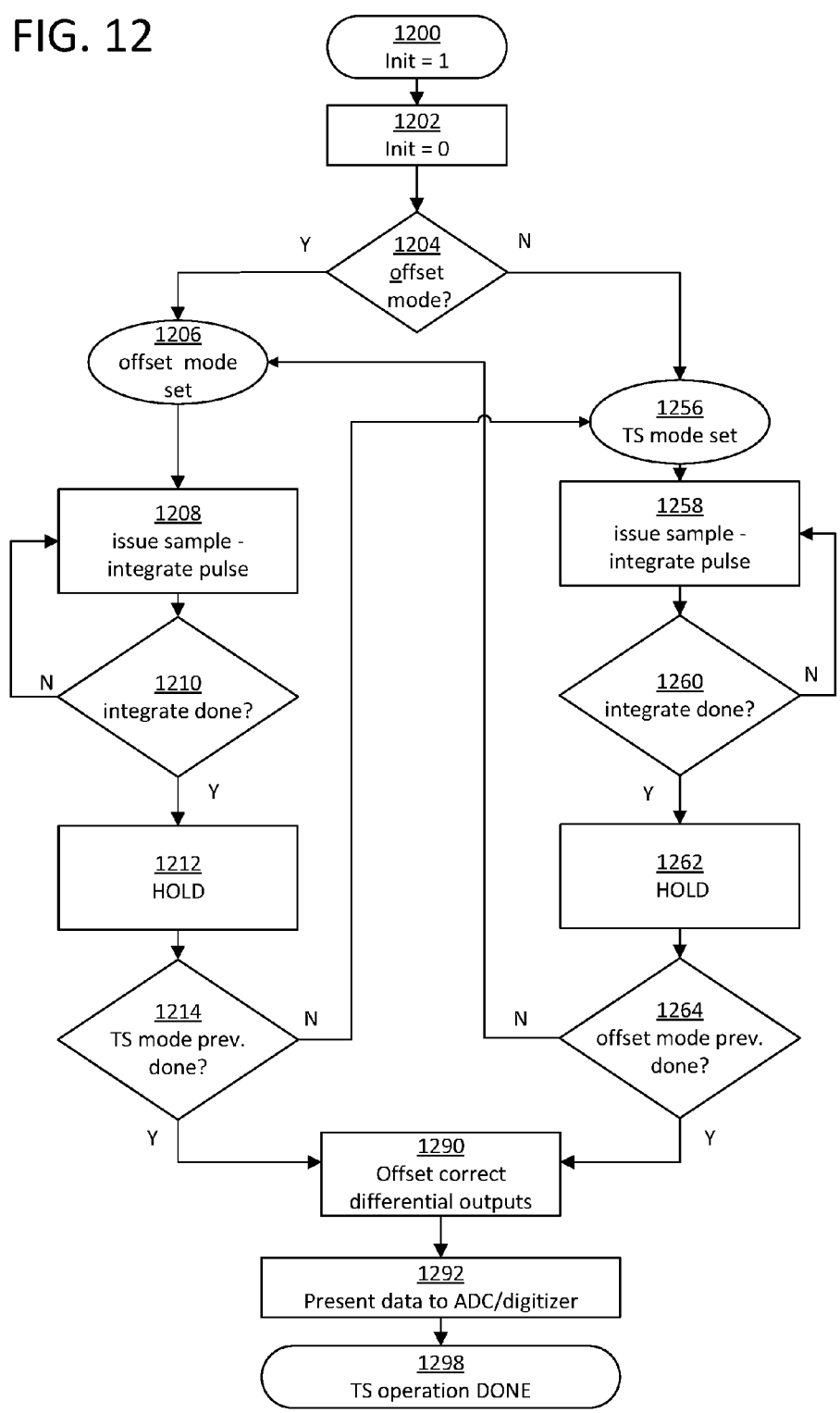
FIG. 12 is a flow chart of the operations of sensor and gain stages with switches set to buff the offset measurement reading.

FIG. 12 is a flow chart of example state machine implementing the measurement phases described herein. In step 1200, phase zero is implemented by turning on the clearing switches. In step 1202 the clearing switches are turned off. In step 1204, the system checks whether a cycle in offset mode is required. If so, the method continues to set the offset mode at step 1206. In step 1208, switches are set for offset measurement of op-amp U1, then a sample is taken, and integration is begun. In step 1210, the number of integration iterations is complete. If not, integration is repeated. In step 1212, the output of the integration is switched on the offset hold capacitor C4. In step 1214, the system then checks whether it is time to conduct a temperature sampling cycle.

If so, the method moves to set the TS mode at step 1256. In step 1258, switches are set for the temperature sensing configuration shown in FIG. 2, then a sample is taken, and integration is begun. In step 1260, the method checks if the number of integration iterations is complete. If not, integration is repeated. In step 1262, the output of the integration is switched on the temperature hold capacitor C3. In step 1264, the system then checks whether it is time to conduct an offset calibration.

Once both $V_{TS\_SAMPLE}$ and $V_{OF\_SAMPLE}$ are available on C3 and C4 respectively, the method proceeds to step 1290.

The system corrects the input referred offsets of both op-amps on the differential output. In step 1292, the differential output voltage in Equation 19 is ready to be, e.g., read out through an analog multiplexer or presented to an ADC to digitize the result.

It will be appreciated that the structures and techniques described herein may be applied to other types of transducers. A system including a non-translinear differential temperature sensor, pressure sensor, strain sensor, gyroscope, magnetometer, accelerometer, or xyz positioning sensor, for example, may be formed through the substitution of other analog components in place of Q1, Q2, $KI_{ref}$, and $I_{ref}$ of FIG. 2. To do so, the switches S20, S22, S24, S26, S28, and S30 may be manipulated as described in reference to FIGS. 2, 8, 11, and 12 to the various transducer measurements, offset measurements, and buffering modes described herein, for example.

The sensor stage 200 and gain stage 300 as described herein has been simulated as being fabricated in a TSMC 65 nm LP CMOS process. FIGS. 13-16 are graphs of simulated performance of an example circuit.

Figure 13:
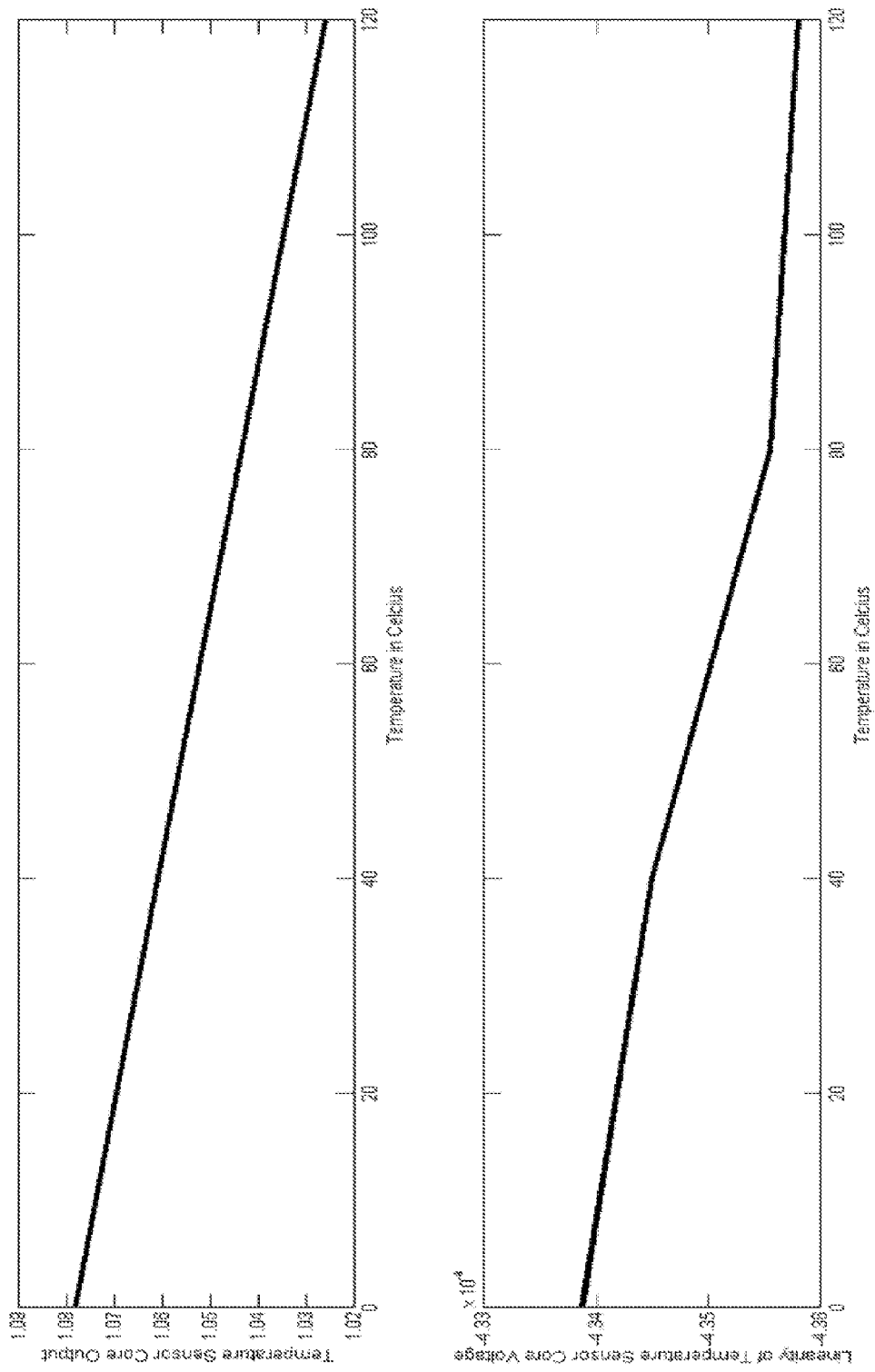
FIG. 13 shows an output of a temperature sensor stage and its linearity.

At the top of FIG. 13 is an example output of a sensor stage 200 in temperature measurement mode. The vertical axis is voltage, and the horizontal axis is temperature. The output essentially maintains its linearity over a range of temperature range from 0° C. to 120° C. At the bottom of FIG. 13 is the linearity of the output using the same horizontal axis. The vertical axis is the change in the output per degree of temperature.

Figure 14:
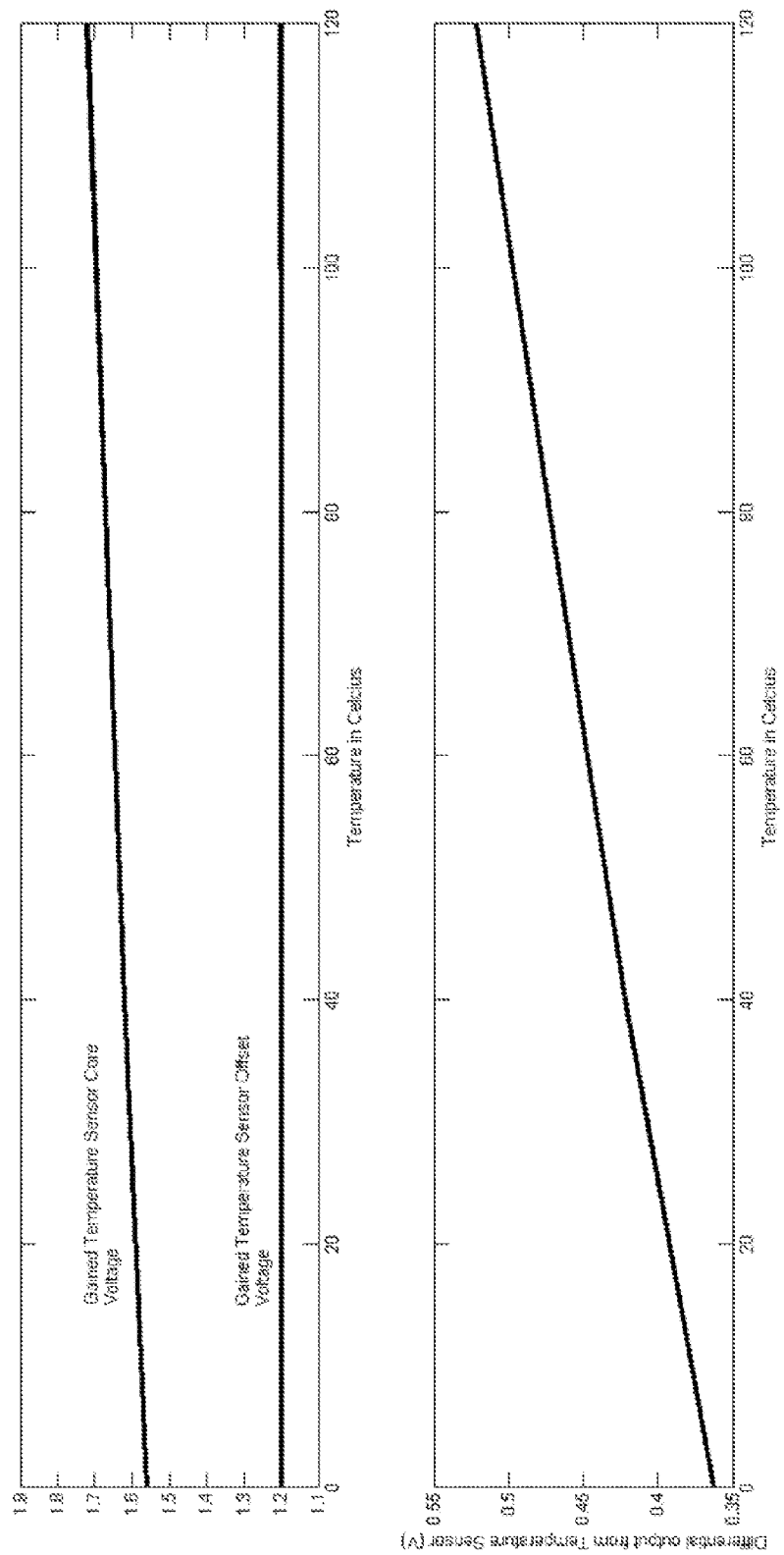
FIG. 14 shows the components of a differential output, including a temperature measurement and an offset measurement output, both after a gain stage, and the combined differential output.

At the top of FIG. 14 is an example of the temperature measurement $V_{TS\_Sample}$ and offset measurement $V_{OS\_Sample}$ voltages produces by the gain stage 300. The vertical axis is voltage and the horizontal axis is temperature. At the bottom of FIG. 14 is an example of the differential output of the system $V_{TS\_SYSTEM}$, again with voltage in the vertical and temperature in the horizontal. This bottom curve is an example of the differential input to an analog-to-digital converter (ADC), again with voltage in the vertical and temperature in the horizontal.

Figure 15:
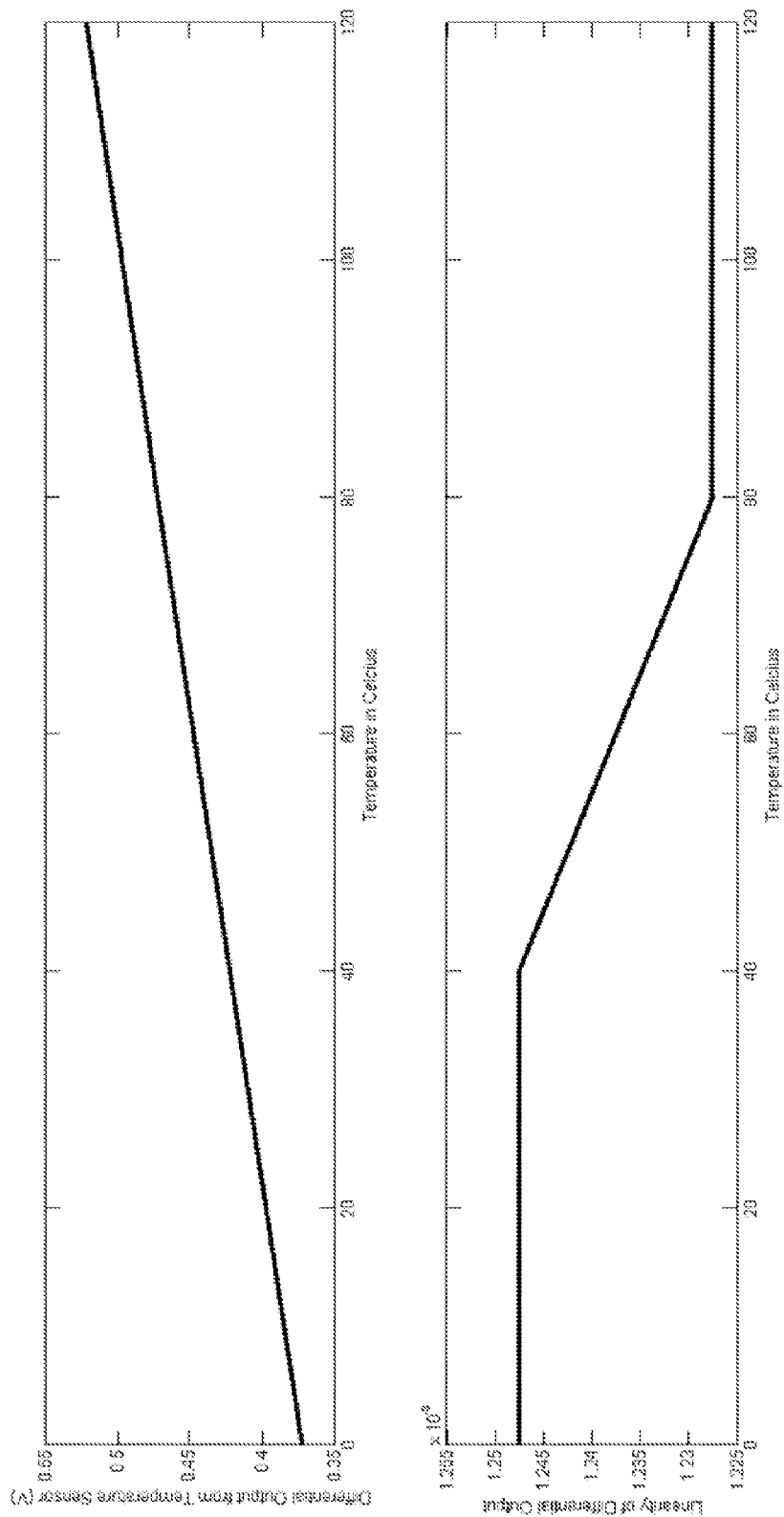
FIG. 15 shows the offset-adjusted output and its linearity.

At the top of FIG. 15 is again the example of the differential output of the system $V_{TS\_SYSTEM}$, shown again with voltage in the vertical and temperature in the horizontal. At the bottom of FIG. 15 is the linearity of $V_{TS\_SYSTEM}$. Again, the system maintains linearity over a large temperature range.

Figure 16:
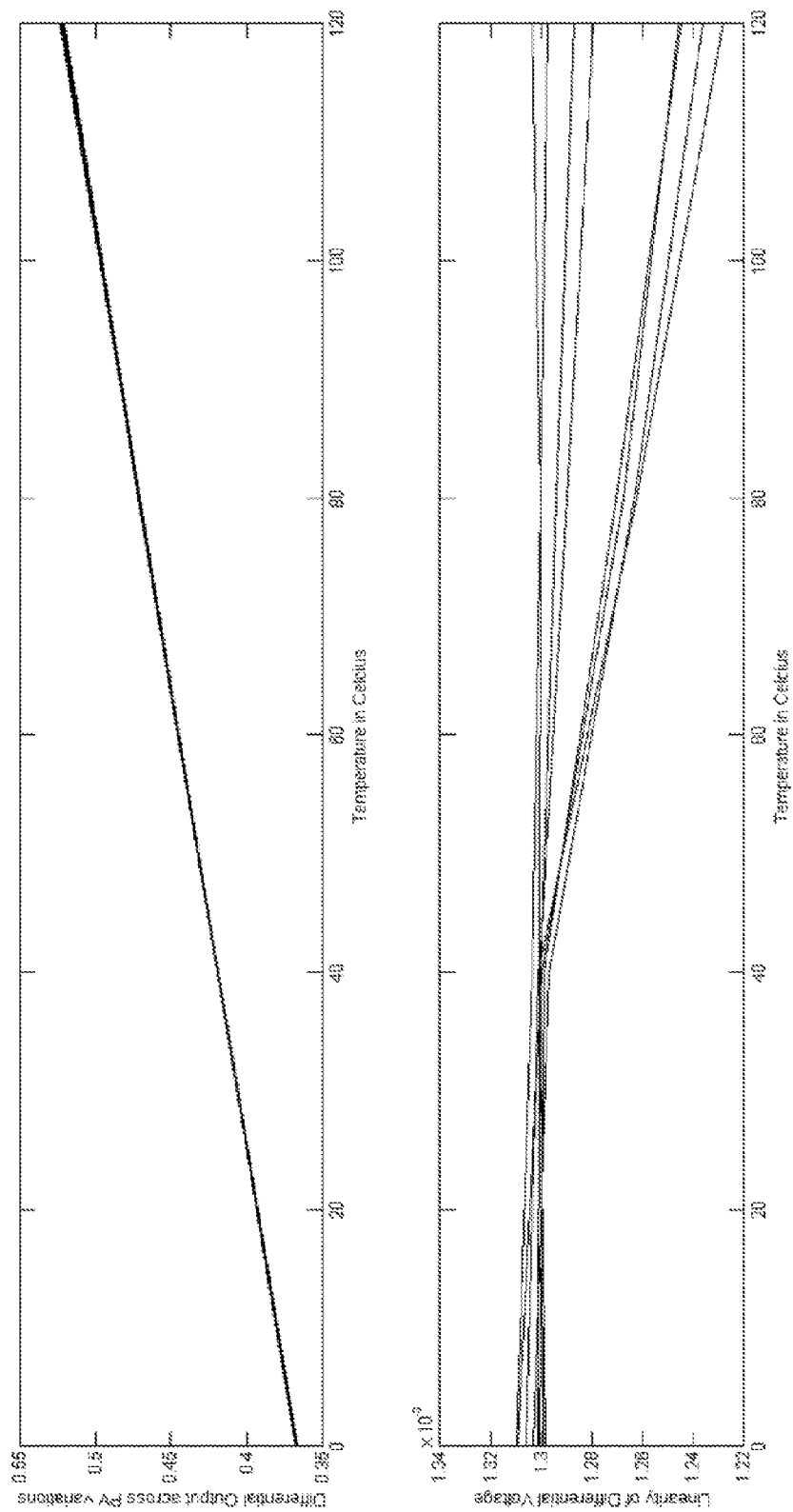
FIG. 16 shows a final output and its linearity for simulated process and operating condition variations.

FIG. 16 shows the performance of the temperature sensor over a variety of process and operating conditions. At the top of FIG. 16 are overlaid curves of $V_{TS\_SYSTEM}$ across various conditions. At the bottom of FIG. 16, are overlaid curves of the linearity of $V_{TS\_SYSTEM}$ across various conditions. In all cases, the differential output values drift very slightly from each other with a maximum error of ±1 mV. With an input referred offset of ±10 mV on each op-amp, the maximum variation on the differential output is simulated to be 260 μV. This represents an expected 40× reduction in system offset voltage compared to the configuration of FIG. 1.

Monte Carlo simulations on the temperature sensor system result in a 1σ variation of 1.54 μV/° C. in the slope of the differential output. To put this number in perspective for production systems, with a 5σ accuracy, a 12-bit ADC will drift by 1 LSB every 33° C.

The temperature sensor system is therefore highly accurate against various process, environmental, and offset conditions. The system maintains high linearity over a wide temperature range, making it suitable for a variety of applications demanding precise temperature readings and sensitivity.

The structures and techniques described herein may be combined in a number of ways to perform transducer and offset measurements. For example, transducer and offset measurements may be derived by first sampling a first output of a first amplifier, where the first amplifier is set in a measurement feedback mode, to create a measurement sample, then integrating the measurement sample using a second amplifier, where the second amplifier is set in a switched capacitor mode, to create a measurement output voltage, and holding the measurement output voltage on a first holding capacitor. Then a second output of the first amplifier may be sampled, where the first amplifier is set in a first buffering mode, to create an offset sample, then integrating the offset sample using the second amplifier in the switched capacitor mode to create an offset output voltage, and then holding the offset output voltage on a second holding capacitor. Finally, the measurement output voltage on the first holding capacitor may be buffered using the second amplifier, where the second amplifier is set in a second buffering mode, to create a final buffered measurement voltage, and the offset output on the second holding capacitor may be buffered using the first amplifier, where the first amplifier is set in a third buffering mode, to create a final buffered offset voltage.

This technique may be enhanced by amplifying the measurement sample or the offset sample by iterating the integration of the second amplifier in the switched capacitor mode. The technique may also be improved where the second amplifier has a differential input comprising a positive input and a negative input, where the second amplifier is set in switched capacitor mode, the positive input is connected to a reference voltage, the negative input is connected to a sampling capacitor, and the output of the second amplifier is connected to negative input by an integrating capacitor, and where the sampling capacitor and the integrating capacitor are of the same value.

These techniques may be used to derive a measurement sample using a transducer circuit, where the transducer circuit comprises the first amplifier in the measurement feedback mode. The transducer may be a translinear PTAT such as described in reference to FIG. 2. The transducer may also be implemented with many other forms of sensors, such as differential temperature sensors including proportional-to-absolute-temperature sensors, and also pressure sensors, strain sensors, gyroscopes, magnetometers, accelerometers, and xyz positioning sensors.

The technique may further include subtracting the final buffered offset output voltage from the final buffered measurement output voltage to derive an offset-adjusted measurement output. The subtraction may be achieved by analog or digital means.

The transducer measurement, offset measurement, and offset-adjusted measurement output may be used to calibrate any kind of temperature sensitive equipment. Such equipment may include image sensors including, for example, depth ranging imagers such as a time-of-flight cameras.

Figure 17:
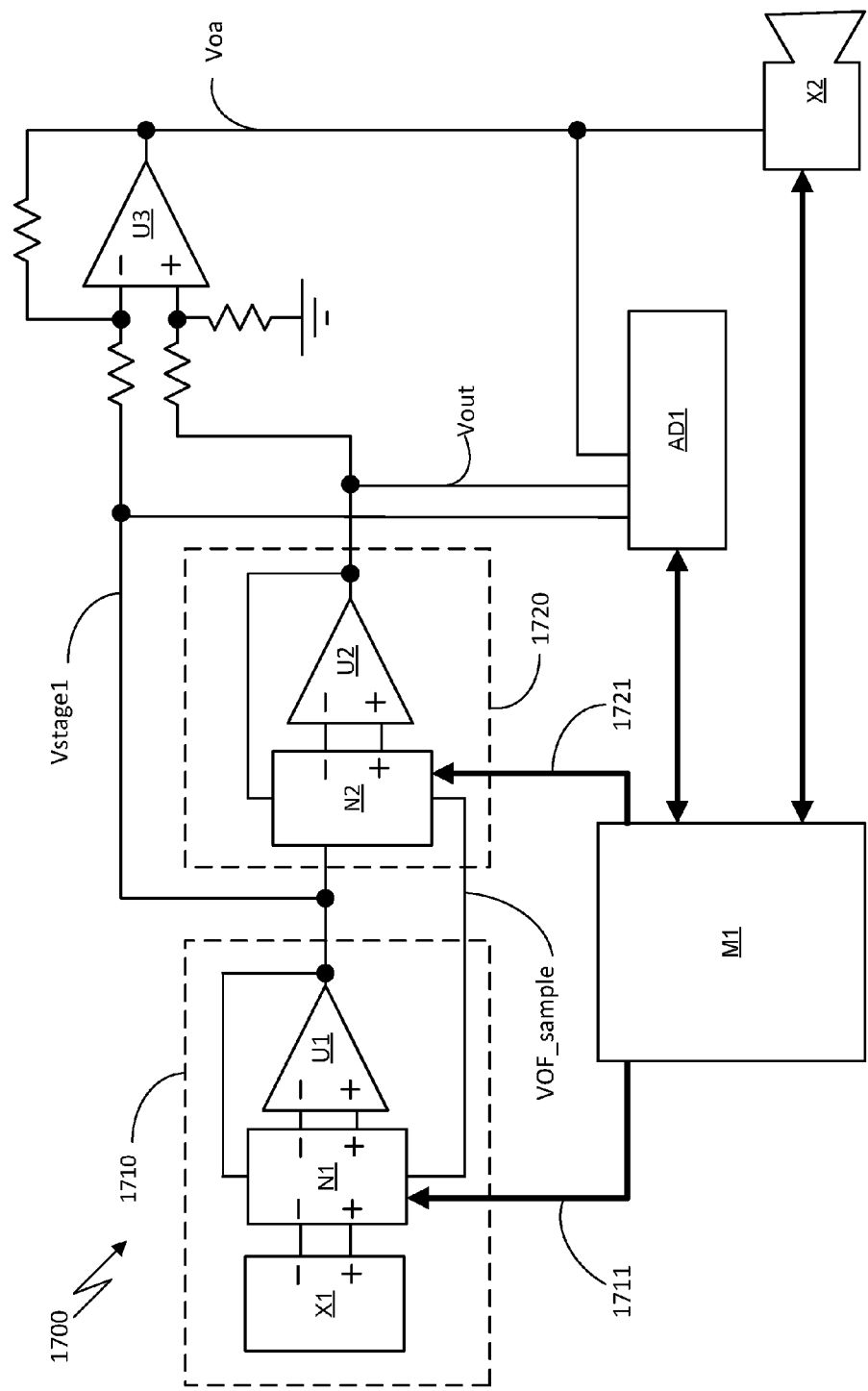
FIG. 17 shows a system including a transducer and amplifiers, and a sensor calibrated by the transducer measurement.

The structures and techniques described herein may be combined in a number of ways to create transducer measurement devices. FIG. 17 illustrates an example system 1700 including a sensor stage 1710, a gain stage 1720, an output amplifier U3, a digital state machine M1, an analog-to-digital converter AD1, and sensor X2. Sensor stage 1710 may be a PTAT sensor stage as described in reference to FIGS. 2, 8, and 11. Sensor stage 1710 includes a differential transducer X1, a switch and passive component network N1, and a first amplifier U1. Operation of network N1 is controlled by signals 1711 from the digital state machine M1.

Digital state machine M1 may include a microprocessor, a microcontroller, a field-programmable logic device, or other digital circuitry implementing the control of switches of amplifiers modes as described, e.g., in reference to FIGS. 2, 3, and 5-12.

The output of sensor stage 1710, $V_{stage1}$, feeds into the gain stage 1720. Gain stage 1720 may be configured as described in reference to FIGS. 3, 5, 6, 7, 9, and 10. It contains a switch and passive component network N2 and a second amplifier U2. Operation of network N2 is controlled by signals 1721 from the digital state machine M1, as described, e.g., in reference to FIGS. 2, 3, and 5-12.

Via operation of the networks N1 and N2, digital state machine M1 causes outputs proportional to the output of the transducer X1 and the offsets of U1 and U2 to be available to other devices. The offset value may be subtracted from the transducer measurement by analog means using a third differential amplifier U3, albeit with the risk of introducing an error due to the offset of amplifier U3. Alternatively, the differential output, consisting of the buffered offset measurement and the buffered transducer measurement may be used directly to calibrate a sensor such as an image sensor.

The output from the amplifier U3, offset-adjusted voltage $V_{oa}$, may then be used to calibrate a sensor X2. For example, sensor X2 may be a time-of-flight depth camera, the output of which may vary with temperature. Transducer X1 may be a temperature sensor such as a translinear PTAT. The temperate measurement as adjusted for offset of the measure system $V_{oa}$ may be used to adjust the output of sensor X2 according to the measured temperature.

Alternatively, the final transducer and offset measurement outputs of the sensor stage 1710 and the gain stage 1720 may be digitized at a time designated by the digital state machine M1 by the analog-to-digital converter AD1. The determination of the offset-adjusted transducer measurement may then be achieved by digital subtraction via the digital state machine M1. Digital state machine M1 may additionally perform adjustment of the output of sensor X2 based on the digitized offset-adjusted measurement of the transducer X1.

For economy and matching of environmental conditions, it may be advantageous to fabricate all the components of system 1700 monolithically. For example, where transducer X1 is a temperature sensor, and sensor X2 is an image sensor, having both devices on the same substrate helps to insure that the temperature measured by the transducer X1 is the temperature experiences by the image sensor X2.

For example, a measurement system may include two amplifiers, where each amplifier has multiple configurable modes. The modes of the first amplifier may include a measurement feedback mode, an offset sampling mode, and an offset buffering mode. The modes of the second amplifier may include an input sampling mode, an integration mode, a measurement output hold mode, an offset output hold mode, and a measurement buffering mode.

A digital state machine may be configured to manipulate the modes of the first and second amplifiers in controlled sequences. A first sequence may include setting the first amplifier in the measurement feedback mode, then setting the second amplifier to the input sampling mode, the integration mode, and the measurement output hold mode in turn. The second sequence may include setting the first amplifier in the offset sampling mode, then setting the second amplifier to the input sampling mode, the integration mode, and offset output hold mode in turn. A third sequence may include setting the first amplifier to the offset buffering mode and setting the second amplifier to the measurement buffering mode.

The system may be improved by, in the first and second sequences, iterating the sampling and integration modes of the second amplifier to achieve switched capacitor amplification.

The system may also be improved where the second amplifier has a differential input comprising a positive input and a negative input, where the second amplifier is set in switched capacitor mode, the positive input is connected to a reference voltage, the negative input is connected to a sampling capacitor, and the output of the second amplifier is connected to negative input by an integrating capacitor, where the sampling capacitor and the integrating capacitor are of the same value.

The system may include a transducer circuit, where the transducer circuit comprises the first amplifier in the measurement feedback mode. The transducer circuit may be a differential temperature sensor such as a proportional-to-absolute-temperature sensor. The transducer may be a translinear PTAT such as described in reference to FIG. 2. The transducer circuit may also be a non-translinear differential temperature sensor, pressure sensor, strain sensor, gyroscope, magnetometer, accelerometer, or xyz positioning sensor.

The system may also include a third amplifier, where the third amplifier is configured to subtract the output of the first amplifier from the output of the second amplifier during the third sequence. Similarly, the third sequence may include triggering the digitizing of output voltages of the first and second amplifier and the digital subtraction of the voltages. The transducer measurement, offset measurement, and offset-adjusted measurement output may be used to calibrate any kind of temperature sensitive equipment. Such equipment may include image sensors including, for example, depth ranging imagers such as a time-of-flight cameras.

We claim:

1. A method of deriving transducer measurement and an offset measurement, comprising:
    sampling a first output of a first amplifier, where the first amplifier is set in a measurement feedback mode, to create a measurement sample;
    integrating the measurement sample using a second amplifier, where the second amplifier is set in a switched capacitor mode, to create a measurement output voltage;
    holding the measurement output voltage on a first holding capacitor;
    sampling a second output of the first amplifier, where the first amplifier is set in a first buffering mode, to create an offset sample;
    integrating the offset sample using the second amplifier in the switched capacitor mode to create an offset output voltage;
    holding the offset output voltage on a second holding capacitor;
    buffering the measurement output voltage on the first holding capacitor using the second amplifier, where the second amplifier is set in a second buffering mode, to create a final buffered measurement voltage; and
    buffering the offset output on the second holding capacitor using the first amplifier, where the first amplifier is set in a third buffering mode, to create a final buffered offset voltage.

2. The method of claim 1, further comprising setting the modes of the amplifiers via a digital state machine, wherein the digital state machine comprises digital logic circuitry, a microprocessor, a microcontroller, or a field-programmable logic device.

3. The method of claim 1, further comprising amplifying the measurement sample or the offset sample by iterating the integration of the second amplifier in the switched capacitor mode.

4. The method of claim 1, wherein the second amplifier comprises a differential input comprising a positive input and a negative input, and when the second amplifier is set in switched capacitor mode the positive input is connected to a reference voltage, the negative input is connected to a sampling capacitor and the output of the second amplifier is connected to negative input by an integrating capacitor, wherein the sampling capacitor and the integrating capacitor are of the same value.

5. The method of claim 2, further comprising deriving the measurement sample using a transducer circuit, where the transducer circuit comprises the first amplifier in the measurement feedback mode.

6. The method of claim 4, where the transducer circuit is a differential temperature sensor, a proportional-to-absolute-temperature sensor, a pressure sensor, a strain sensor, a gyroscope, a magnetometer, an accelerometer, or an xyz positioning sensor.

7. The method of claim 6, further comprising:
digitizing the final buffered offset voltage and the final buffered measurement voltage; and
subtracting the digitized final buffered offset voltage from the digitized buffered measurement voltage.

8. The method of claim 7, further comprising calibrating an operation of an image sensor using the digitized final buffered offset voltage from the digitized buffered measurement voltage.

9. A measurement system, comprising:
a first amplifier with configurable modes, the modes of the first amplifier comprising:
a measurement feedback mode,
an offset sampling mode, and
an offset buffering mode;
a second amplifier with configurable modes, the modes of the second amplifier comprising:
an input sampling mode,
an integration mode,
a measurement output hold mode,
an offset output hold mode,
a measurement buffering mode; and
a digital state machine configured to manipulate the modes of the first and second amplifiers in controlled sequences, the sequences comprising:
a first sequence comprising setting the first amplifier in the measurement feedback mode, then setting the second amplifier to the input sampling mode, the integration mode, and the measurement output hold mode;
a second sequence comprising setting the first amplifier in the offset sampling mode, then setting the second amplifier to the input sampling mode, the integration mode, and offset output hold mode; and
a third sequence comprising setting the first amplifier to the offset buffering mode and setting the second amplifier to the measurement buffering mode.

10. The measurement system of claim 1, wherein the digital state machine comprises digital logic circuitry, a microprocessor, a microcontroller, or a field-programmable logic device.

11. The measurement system of claim 9, wherein the first and second sequences comprise iterating the sampling and integration modes of the second amplifier to achieve switched capacitor amplification.

12. The measurement system of claim 9, wherein the second amplifier comprises a differential input comprising a positive input and a negative input, and when the second amplifier is set in switched capacitor mode the positive input is connected to a reference voltage, the negative input is connected to a sampling capacitor, and the output of the second amplifier is connected to negative input by an integrating capacitor, wherein the sampling capacitor and the integrating capacitor are of the same value.

13. The measurement system of claim 9, further comprising a transducer circuit, where the transducer circuit comprises the first amplifier in the measurement feedback mode.

14. The measurement system of claim 9, where the transducer circuit is a proportional-to-absolute-temperature sensor, a differential temperature sensor, pressure sensor, strain sensor, gyroscope, magnetometer, accelerometer, or xyz positioning sensor.

15. The measurement system of claim 9, further comprising an analog to digital converter, where the analog to digital converter is configured to separately digitize the output of the first amplifier and the output of the second amplifier during the third sequence.

16. The measurement system of claim 15, further comprising an image sensor, wherein the digitized outputs of the first amplifier and the output of the second amplifier are used to calibrate an operation of the image sensor.

17. A depth camera system, comprising:
an image sensor;
a digital state machine comprising digital logic circuitry, a microprocessor, a microcontroller, or a field-programmable logic device;
an analog to digital converter;
a first amplifier with configurable modes and a second amplifier with configurable modes; and
a temperature sensor comprising a translinear proportional-to-absolute-temperature transducer circuit;
where the modes of the first amplifier comprise
a measurement feedback mode,
an offset sampling mode, and
an offset buffering mode;
where the modes of the second amplifier comprise
an input sampling mode,
an integration mode,
a measurement output hold mode,
an offset output hold mode,
a measurement buffering mode; and
where the digital state machine is configured to manipulate the modes of the first and second amplifiers in controlled sequences, the sequences comprising:
a first sequence comprising setting the first amplifier in the measurement feedback mode, then setting the second amplifier to the input sampling mode, the integration mode, and the measurement output hold mode;
a second sequence comprising setting the first amplifier in the offset sampling mode, then setting the second amplifier to the input sampling mode, the integration mode, and offset output hold mode; and
a third sequence comprising setting the first amplifier to the offset buffering mode, setting the second amplifier to the measurement buffering mode, digitizing the buffered offset and the buffered measurement, and using the digitized buffered offset and measurement to calibrate a reading of the image sensor.

18. The depth camera system of claim 17, where the transducer circuit comprises the first amplifier in the measurement feedback mode.

19. The depth camera system of claim 18, wherein the second amplifier comprises a differential input comprising a positive input and a negative input, and when the second amplifier is set in switched capacitor mode the positive input is connected to a reference voltage, the negative input is connected to a sampling capacitor, and the output of the second amplifier is connected to negative input by an integrating capacitor, wherein the sampling capacitor and the integrating capacitor are of the same value.

20. The depth camera system of claim 19, wherein the first and second sequences comprise iterating the sampling and integration modes of the second amplifier to achieve switched capacitor amplification.

\* \* \* \* \*